US009514800B1

(12) United States Patent
Liu

(10) Patent No.: US 9,514,800 B1
(45) Date of Patent: Dec. 6, 2016

(54) DRAM AND SELF-REFRESH METHOD

(71) Applicant: Bo Liu, Milpitas, CA (US)

(72) Inventor: Bo Liu, Milpitas, CA (US)

(73) Assignee: Bo Liu, Milpitas, CA (US)

( * ) Notice: Subject to any disclaimer, the term of this patent is extended or adjusted under 35 U.S.C. 154(b) by 0 days.

(21) Appl. No.: 15/081,849

(22) Filed: Mar. 26, 2016

(51) Int. Cl.
| | |
|---|---|
| *G11C 7/00* | (2006.01) |
| *G11C 11/406* | (2006.01) |
| *G11C 11/4096* | (2006.01) |
| *G11C 29/44* | (2006.01) |
| *G11C 29/02* | (2006.01) |
| *G11C 11/4076* | (2006.01) |
| *G11C 8/18* | (2006.01) |
| *G11C 11/4074* | (2006.01) |

(52) U.S. Cl.
CPC ........... *G11C 11/40615* (2013.01); *G11C 8/18* (2013.01); *G11C 11/406* (2013.01); *G11C 11/4076* (2013.01); *G11C 11/4096* (2013.01); *G11C 29/02* (2013.01); *G11C 29/44* (2013.01); *G11C 11/4074* (2013.01)

(58) Field of Classification Search
CPC .............. G11C 11/406; G11C 11/4076; G11C 11/4074; G11C 8/18; G11C 29/02
USPC .................................................. 365/149, 150
See application file for complete search history.

(56) References Cited

U.S. PATENT DOCUMENTS

| | | | | |
|---|---|---|---|---|
| 5,432,743 A | * | 7/1995 | Kusakari .............. | G11C 7/1006 365/189.02 |
| 6,560,725 B1 | * | 5/2003 | Longwell .............. | G06F 11/073 711/105 |
| 6,618,314 B1 | * | 9/2003 | Fiscus ................... | G11C 11/406 365/222 |
| 7,075,847 B2 | * | 7/2006 | Kim .................. | G11C 11/40626 327/512 |
| 7,869,297 B2 | | 1/2011 | Kim | |
| 8,310,893 B2 | | 11/2012 | Luthra et al. | |
| 8,395,957 B2 | * | 3/2013 | Song ..................... | G11C 11/406 365/195 |
| 8,520,461 B2 | * | 8/2013 | Lee ........................ | G11C 11/406 365/222 |
| 8,982,654 B2 | | 3/2015 | Dong et al. | |

* cited by examiner

*Primary Examiner* — Pho M Luu

(57) ABSTRACT

A dynamic random access memory (DRAM) with code bit and self-refresh operation is disclosed. In one particular exemplary embodiment, at least one code bit is appended to N bits of user data to form a new code data. The user data are stored in a plurality of user data sub-arrays and code bit is stored in code bit sub-array respectively. Each sub-array stores at least one bit per user-specified row and column address. Each sub-array is independently controlled in either refresh operation or user operation.

Refresh operation works on at least one sub-array at a time out of a plurality of sub-arrays. User operations work on other sub-arrays out of a plurality of sub-arrays. User read operation and internal refresh operation can work concurrently.

5 Claims, 5 Drawing Sheets

|  | LSB | | | | | | | MSB | Even Parity |
|---|---|---|---|---|---|---|---|---|---|
|  | bit0 | bit1 | bit2 | bit3 | bit4 | bit5 | bit6 | bit7 | bit8 |
| Example1 | 0 | 1 | 1 | 0 | 1 | 1 | 1 | 0 | 1 |
| Example2 | 1 | 1 | 1 | 0 | 0 | 1 | 0 | 0 | 0 |
| Example3 | 0 | 0 | 0 | 0 | 0 | 0 | 0 | 1 | 1 |

FIG.3

DRAM AND SELF-REFRESH METHOD

TECHNICAL FIELD

The present disclosure generally relates to semiconductor memory techniques. More specifically, the present disclosure relates to memory arrays arrangement and methods to refresh dynamic random access memory (DRAM).

BACKGROUND OF THE INVENTION

Dynamic random access memory (DRAM) stores data on small capacitors. Because the charge on the small capacitor leaks away through multiple different leakage paths, the memory has to refresh the cell capacitor periodically and thus not static. DRAM can't be accessed by user operation during self-refresh operation, user operation needs to wait until refresh is finished. Thus the refresh timing impacts the performance of the memory and system. With the development of higher density DRAM and smaller feature size, the refresh operation may take longer time. Conventional solution for reducing refresh penalty is to use comparator to detect user address and refresh address conflict. If user operation and refresh operation are on different banks or on different row addresses, both operations can work at same time. Nevertheless, if addresses of both operations are the same and there is an address conflict, either the refresh operation has to abort or the user read operation has to wait. In such scenarios, the memory user read performance is downgraded and constant user read speed cannot be ensured across address scope.

Therefore, a dynamic random access memory with read address conflict free and refresh transparent to user is desired.

BRIEF SUMMARY OF THE INVENTION

The present invention describes a method for data storage in DRAM bank by distributing N bits of user data into a plurality of sub-arrays. Each sub-array stores at least one bit data for a specific user row and column address.

This method further comprising appending at least one code bit generated by a code bit generator circuit to N bits of user data to form a new code data. This new code data will be distributed through an internal bank bus into a plurality of user sub-arrays and at least one code bit sub-array. The said plurality of sub-arrays storing user data are user sub-arrays, and the said sub-array storing code bit is code bit sub-array. The user read/write operation or self-refresh operation will be single sub-array based in such a way that at least one sub-array performs the self-refresh operation while the other sub-arrays are in rea/write operation.

According to aspects of the present disclosure, out of the plurality of sub-arrays, the user can read out N bits data from the user sub-arrays at any time during read operation, the remaining refreshing sub-array is not accessible.

According to another aspect of the present disclosure, in one embodiment of read operation, the refreshing sub-array stores at least one bit of the user data and this sub-array is not accessible and may supply an unknown bit to the internal data bus, and the other bits are successfully read out from other sub-arrays. The memory of present invention also comprises an error detection and correction circuit. The error detection and correction circuit may generate an error when the refreshing sub-array is not accessible. The error bit comes from the refreshing sub-array and this specific bit is inverted and read out data is correct.

According to other aspects of the present disclosure, there is no error and the read out data is correct.

In another embodiment, the code bit sub-array is doing the self-refreshing operation and the read out N bits data are from the user data sub-arrays. Therefore, this N bits data is the correct user data.

According to further aspects of the present disclosure, when a sub-array is in the read operation, the self-refresh operation needs to wait until the read operation is finished. In this scenario, the user read operation timing is not affected.

According to aspects of the present disclosure, the user write operation supplies N bits user data to the bank's N user sub-arrays and code bit generator circuit generates a code bit and writes into a code bit sub-array.

According to further aspects of the present disclosure, the user write operation timing includes timing delay from IO pads and address decoding and bus routing from user IO to bank internal sub-arrays. And therefore the user write operation has a longer timing period than internal sub-array level refresh or write operation. For a sub-array currently in refresh operation, the sub-array write operation will be delayed until the refreshing operation is finished.

The present invention describes a self-refresh conflict free and transparent method for DRAM. The user operation and refresh operation can be independently controlled on a sub-array and on a single bit. By using additional code bit or bits, the memory can read out data immediately even when one sub-array or one bit is not readable.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

A better understanding of the nature and advantages of the present invention will be gained with reference to the detailed description below and the accompanying drawings.

BRIEF DESCRIPTION OF THE DRAWINGS

FIG. 3 shows a table of a few examples of even parity bit for 8 bits user data.

DETAILED DESCRIPTION OF THE INVENTION

The detailed description below, together with the appended drawings, are intended as a description of various configurations and are not intended to represent the only configurations in which the concepts described herein may be practiced.

There are many embodiments described and illustrated herein. In one aspect, the present invention describes a user data storage method for memory, specifically for DRAM, to improve memory performance.

Furthermore the user read operation and internal self-refresh can work concurrently to reduce data access time and improve performance.

Figure 1:
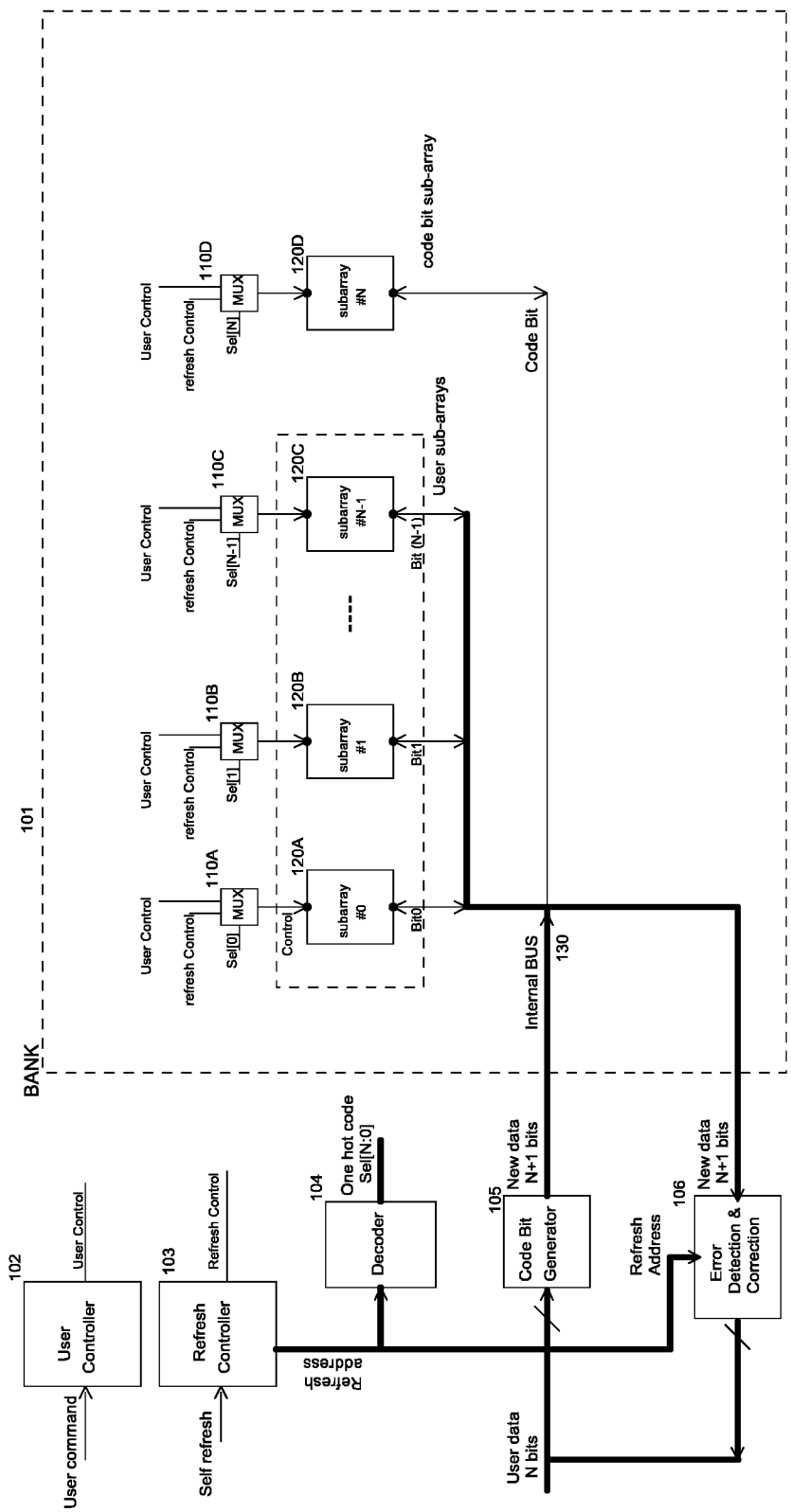
FIG. 1 shows a block diagram of DRAM and sub-arrays arrangement according to one embodiment of the present invention.

Referring to FIG. 1, there is shown a block diagram of a dynamic random access memory (DRAM) according to one embodiment of the present invention. In this example, the memory contains memory bank 101, user controller 102, self-refresh controller 103, decoder 104, code bit generator 105, error detection & correction circuit 106. Inside the memory bank 101, there are MUX 110, sub-arrays 120, and an internal bus 130.

The user controller 102 receives user command signal to generate sub-arrays' control signals and put a plurality of sub-arrays to work in read or write operation. The self-refresh controller 103 receives chip internal self-refresh signal to generate sub-array control signals and put at least one specific sub-array to work in refresh operation.

The MUX 110A receives control signals from both controller 102 and 103; it also receives the selection signal sel[0] from decoder 104. The output of MUX 110A controls sub-array 120A. In an exemplary embodiment, if sel[0]=0 the user control signals are controlling sub-array 120A through MUX 110A and put sub-array 120A to work in user read/write operation; if sel[0]=1 the self-refresh control signals are controlling sub-array 120A through MUX 110A and put sub-array 120A to work in self-refresh operation.

There are N+1 sub-arrays inside the memory bank 101. Each has its corresponding MUX circuit and respective connections with the control signals. The self-refresh controller 103 further generates refresh address to select a sub-array to do refresh operation.

The Decoder 104 receives the sub-array refresh address from refresh controller 103 and generates sub-arrays selection signals sel[N:0]. These selection signals are one-hot-code signals, at least one sub-array is selected for refresh operation while other sub-arrays are selected for user read/write operations. For example, for 9 sub-arrays selections, if sel[8:0]="000000001" then only sub-array #0 is selected for refresh operation and other 8 sub-arrays work in user operations.

In conventional memory bank design, the N bits user data is written into one sub-array and the other sub-arrays are in idle.

According to one aspect of the present invention, each sub-array stores at least one bit per user address. The N bits user data are distributed into N sub-arrays with each sub-array storing one bit respectively. Each sub-array is constructed with multiple wordlines and multiple bitlines. A sub-array is accessed only by using a specific row address and column addresses.

According to further aspect of present invention, out of the N+1 sub-arrays inside the bank 101, there is a specific sub-array which stores the code bit, and the other sub-arrays are user sub-arrays and store only user data.

In one embodiment of the present invention, 120D is a code bit sub-array which stores the code bit from the code bit generator 105.

The code bit generator 105 has N bits data input from user write operation and generates an additional code bit. The code bit is stored in the code bit sub-array 120D.

The original N bits user data and the new code bit together form a new code data and this data feeds into N+1 sub-arrays with each sub-array storing one bit only through the internal bus 130. Bus 130 is an N+1 bits bus inside the bank 101. Bus 130 is used to connect the N+1 sub-arrays with the code bit and the original N bits user data.

The BUS 130 is also connected to error detection and correction circuit 106. Circuit 106 has N+1 bits input from N+1 sub-arrays inside the bank 101 and generates N bits data for user to read out. The circuit 106 also has refresh address information to tell which bit is from the refreshing sub-array. The bit from refreshing sub-array may not be correct when this sub-array is doing the refreshing operation. Circuit 106 will detect if there is an error in this read out N+1 bits data.

If there is an error, this bit is incorrect and is inverted. If there is no error, this bit is correct and keep unchanged.

In an exemplary embodiment of the self-refresh operation concurrently working with user read operation, the user's read or write operation or internal self-refresh operation will be sub-array level based in such a way that at least one sub-array is doing the self-refresh operation and the other sub-arrays are controlled by user controller for read or write operation.

According to one aspect of the present invention, the user can read out N bits data from N sub-arrays that work in user read operation through the control signal from MUX 110 during user read operations. The remaining sub-array, which is in refresh operation, is not readable. Although the refreshing sub-array is not readable, the internal bus 130 still connects to the refreshing sub-array and supplies one bit to circuit 106. The other N bits are successfully read out from the other sub-arrays.

In present invention, in one embodiment, circuit 106 detects an error based on N+1 bits input and circuit 106 also receives the refresh sub-array address. The error bit is from the refreshing sub-array and this specific bit will be inverted. According to other aspects of the present disclosure, circuit 106 does not detect an error and all bits are correct.

In another embodiment, the code bit sub-array 120D is in the refreshing operation and user reads out N bits data from a plurality of user sub-arrays. This N bits data is the user data. Therefore, refreshing bit inversion is unnecessary.

According to further aspects of the present disclosure, when a sub-array is in the read operation, the self-refresh operation has to wait until the read operation is finished. In this scenario, the user read operation timing is not affected.

According to aspects of the present disclosure, the user write operation timing includes timing delay from IO pads and address decoding and bus routing from IO to internal sub-array. The user write operation takes a longer timing period than internal sub-array level refresh or write operation.

According to aspects of the present disclosure, the user write operation supplies N bits user data to the bank's user sub-arrays, and code bit generator circuit generates code bit and writes into code bit sub-array. For a sub-array currently in refresh operation, the write operation on that sub-array will be delayed until the refreshing operation is finished.

Figure 2:
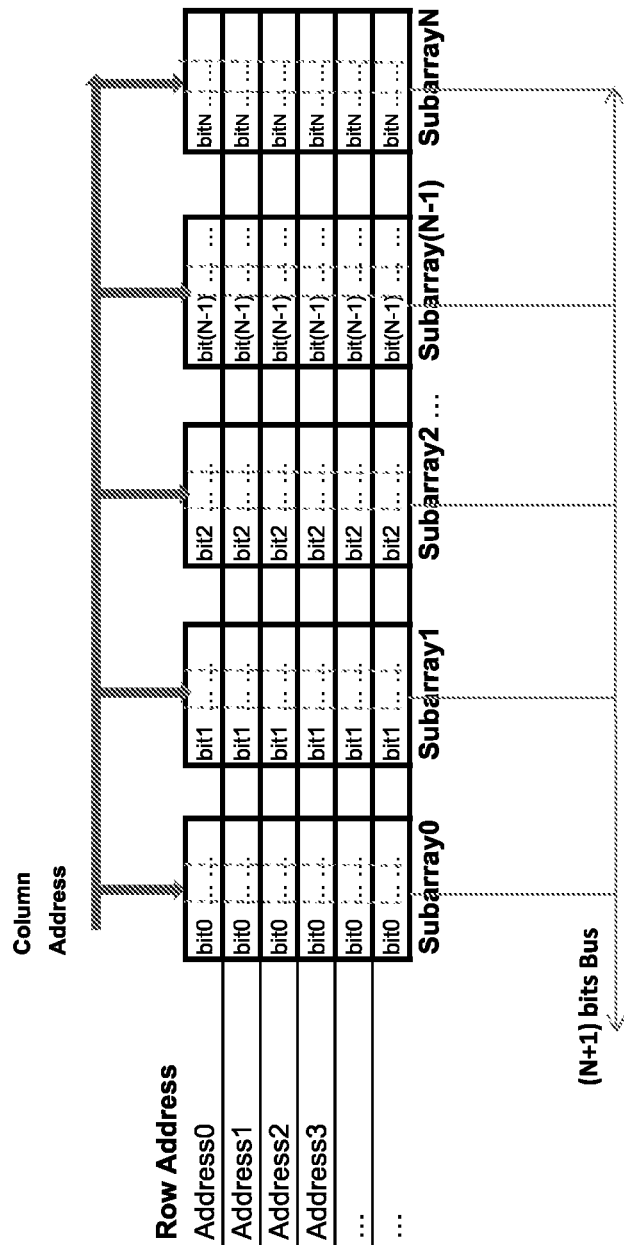
FIG. 2 is block diagram of the present invention's data storage method for data distributed into a plurality of sub-arrays with each sub-array storing one bit out of a plurality of bits.

Referring to FIG. 2, there is shown a detailed block diagram of multiple sub-arrays and their connections inside a memory bank. Each sub-array is formed by a plurality of wordlines and a plurality of bitlines. In conventional design, a single sub-array reads out N bits data per user address. In present invention a plurality of sub-arrays read out N bits data per user address. Each sub-array shares the same row and column in the bank.

Referring to FIG. 3, the table shows code bit example of even parity. The table has 3 examples of 8 bits even parity cases. The parity bit and 8 bits data form a new 9 bits data. In the exampled even parity cases, the number of "1" bits in the new 9 bits data is an even number. In this figure, example1 has six "1" bits, example2 has four "1" bits and example3 has two "1" bits. They all meet the even parity criteria. If one of the bits is doing refreshing operation, the read out bit may not be correct and thus an error is generated. It should be expressly understood that the parity bit in this implement is one example of various code bit algorithms, it may be other various code bits with equivalent functionality of error detection and correction. Other code bit algorithm may also be used without departing from the feature and scope of the present invention.

Figure 4:
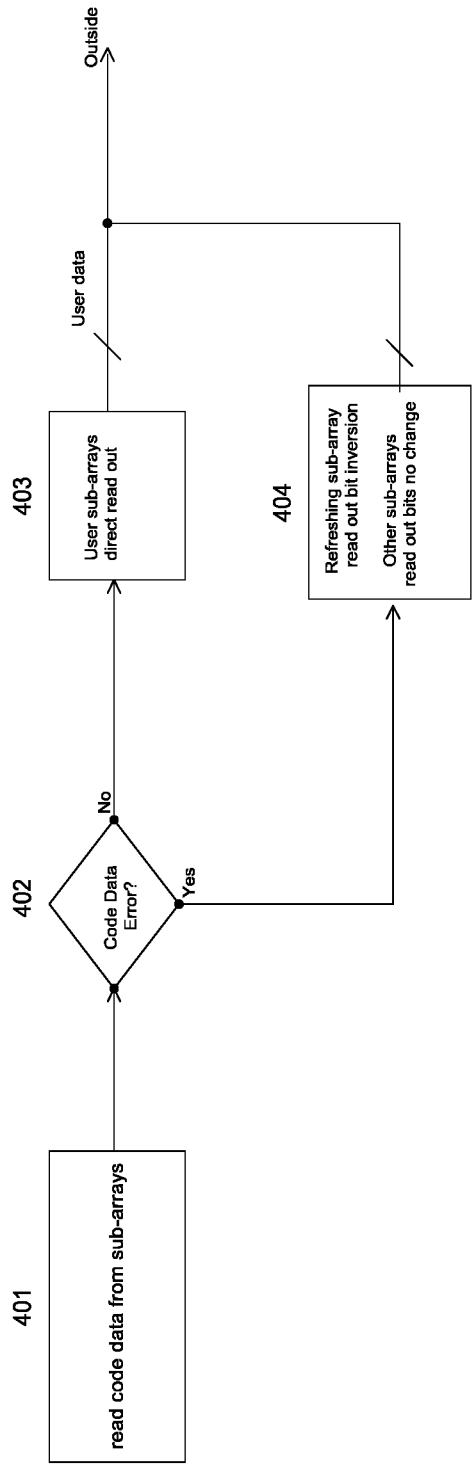
FIG. 4 is a functional block diagram for DRAM read operation when using an additional code bit.

Referring to FIG. 4, there is shown the function of DRAM user reading operation. At block 401, the DRAM receives the read operation instruction from user. The user controller 102 in FIG. 1 starts to generate user control signals and N sub-arrays will work in read operation. N bits data will be read out based on the user input row and column address according to FIG. 2.

In the same time, one sub-array is doing the refreshing operation and the output bit may not be correct. At block 402, it checks the code data error. If there is no error, then user sub-arrays can directly output the N bits data. This is illustrated through the block of 403. If there is an error, it means that the refreshing sub-array read out bit is incorrect and needs to be inverted while other N bits keep unchanged. After the inversion, the new code data is correct. This is illustrated through the block of 404. The N bits user data is from the N sub-arrays which are assigned as user sub-arrays in FIG. 1.

Figure 5:
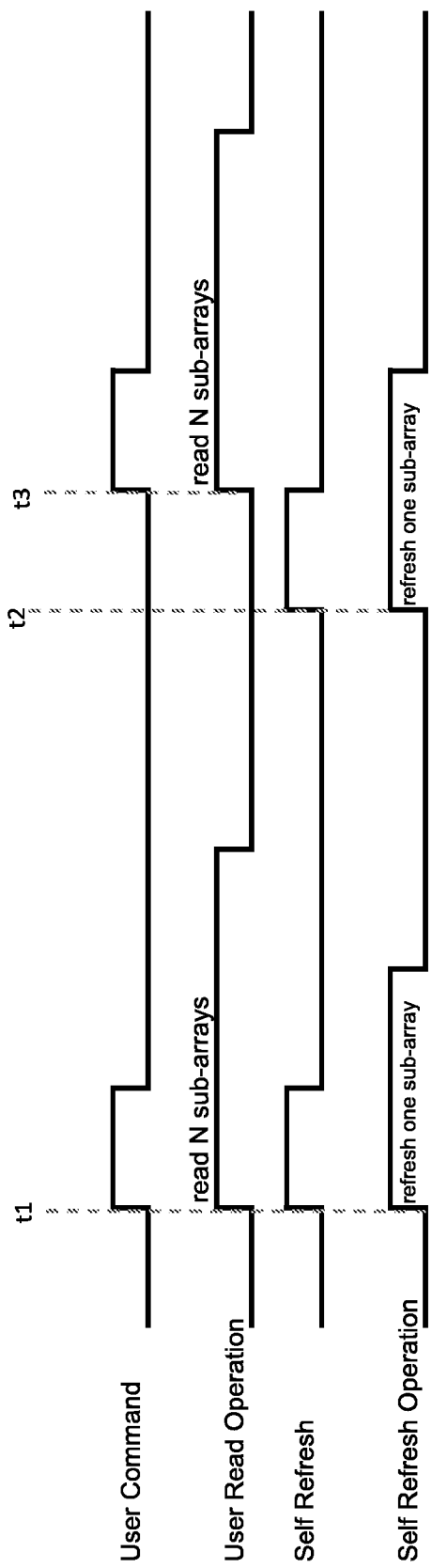
FIG. 5 shows a timing diagram illustrating user read and self-refresh operation work concurrently.

Referring to FIG. 5, there is shown a timing diagram of concurrently read and refresh operations. At time t1 user read operation and internal self-refresh operation start together. The read operation works on N sub-arrays, in the mean time the refresh operation works on the remaining sub-array. Through the error detection and correction method mentioned above, the N bits user data can be read out.

In another case, user command comes later than self-refresh operation. At time t2, internal self-refresh operation works on one sub-array and other N sub-arrays are idle. At time t3, user issues a command for read operation. In conventional design the refresh operation has to stop or read operation has to wait or an extra internal circuit needs to be added to detect conflict of refresh and read addresses. In the present invention, the read operation starts immediately when user issues read command and N sub-arrays starts to work in read operation.

Through the method of error detection and correction mentioned above, the N bits user data can be read out even when one sub-array is in refreshing operation.

It is to be understood that the inventive concept as described herein can apply to memory circuits organized in different numbers of sub-arrays as well.

The above description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but are to be accorded the widest scope consistent with the principles and novel features disclosed herein.

What is claimed is:

1. A dynamic random access memory (DRAM) with user refresh operation free comprising:
   a) a bank with a plurality sub-arrays;
   b) a code bit generator circuit which generates at least one code bit to append to N bits user data to form a new code data;
   c) a conflict bit detection and correction circuit to detect and convert the conflict bit in code data when concurrently reading and refreshing the same address according to sub-array selection signals;
   d) a self-refresh controller, and
   e) a user read/write controller.

2. The memory of claim 1, wherein the plurality of sub-arrays consists of a plurality of user data sub-arrays and at least one code bit sub-array.

3. A method for storing data into DRAM comprising:
   a) using a code bit generator circuit to generate code bit and append to a N bits user data to form a new code data, wherein the N bits user data are distributed into a plurality of sub-arrays;
   b) distributing the code data into a plurality of sub-arrays through an internal bus and each sub-array stores at least one bit per user address, wherein the said code data consists of N bits user data and the said appended code bit, and each sub-array is independently controlled in either self-refreshing operation or user read/write operation.

4. A method for concurrently reading/refreshing DRAM, compromising:
   selecting at least one sub-array for refreshing operation, and
   selecting a plurality of sub-arrays for reading operation at same time, wherein said all selected sub-arrays provide at least one code data per user address with each individual sub-array provides at least one bit per user address, and said the code data is correctable through conflict bit detection and conversion circuit according to the address of refreshing sub-array, which indicates conflict bit location in the code data.

5. A method of using refresh operation free DRAM in electronic system, wherein no refresh command is required from external user control, and said refresh free DRAM uses memory internal circuits to control self-refresh operation while user can issue read/write command concurrently without timing delay and confliction from internal self-refresh operation.

* * * * *